United States Patent
Burns

(10) Patent No.: US 6,478,888 B1
(45) Date of Patent: Nov. 12, 2002

(54) PREHEAT METHOD FOR EBPVD COATING

(75) Inventor: Steven M. Burns, Waterbury, CT (US)

(73) Assignee: United Technologies Corporation, Hartford, CT (US)

(*) Notice: Subject to any disclaimer, the term of this patent is extended or adjusted under 35 U.S.C. 154(b) by 0 days.

(21) Appl. No.: 08/996,650

(22) Filed: Dec. 23, 1997

(51) Int. Cl.⁷ ................................................. C23C 8/06
(52) U.S. Cl. ........................ 148/280; 148/284; 148/285; 427/255.19; 427/255.31; 427/255.4
(58) Field of Search ........................ 427/255.19, 255.31, 427/255.4; 148/280, 284, 285

(56) References Cited

U.S. PATENT DOCUMENTS

| | | | |
|---|---|---|---|
| 4,405,659 A | 9/1983 | Strangman | 427/248.1 |
| 4,449,714 A * | 5/1984 | Meier | 277/9 |
| 4,676,994 A | 6/1987 | Demaray | 427/42 |
| 4,880,614 A | 11/1989 | Strangman et al. | 428/623 |
| 4,944,858 A * | 7/1990 | Murphy et al. | 204/192.15 |
| 5,087,477 A | 2/1992 | Giggins, Jr. et al. | 427/38 |
| 5,262,245 A | 11/1993 | Ulion et al. | 428/469 |
| 5,514,482 A | 5/1996 | Strangman | 428/623 |
| 5,538,796 A | 7/1996 | Schaffer et al. | 428/469 |
| 5,601,652 A | 2/1997 | Mullin et al. | 118/723 |
| 5,843,587 A * | 12/1998 | Nakamori et al. | 428/637 |

FOREIGN PATENT DOCUMENTS

EP 0 733 723 A1 * 9/1996

* cited by examiner

*Primary Examiner*—John Sheehan
*Assistant Examiner*—Andrew L. Oltmans

(57) ABSTRACT

A method is described for reducing surface oxide growth which heating aluminum containing surfaces in a vacuum environment prior to the deposition of a ceramic coating. The method comprises flowing an inert or non reactive gas into the coating apparatus adjacent to the surface to be coated to reduce oxygen reaction with the surface.

19 Claims, No Drawings

PREHEAT METHOD FOR EBPVD COATING

BACKGROUND OF THE INVENTION

Thermal barrier coatings (TBC) are becoming widely used in gas turbine engines. The most durable type of TBC coating is that which is deposited by electron beam physical vapor deposition (EBPVD) which consists of a substrate, a bond coat on the substrate and a columnar grain ceramic material adhered to the bond coat (the bond coat may be omitted in certain situations, hereinafter the word bond coat will be used to refer to the bond coat or the substrate if no bond coat is present). Adherence of the ceramic coating to the bond coat is critical and this is accomplished through the provision of the thin intermediate layer of a thermally grown oxide (TGO), consistingly essentially of alumina, on the surface of the bond coat prior to the application of the ceramic top coat.

This process is shown and described for example in U.S. Pat. Nos. 4,405,659 and 5,514,482. The contents of these patents are incorporated herein by reference. U.S. Pat. No. 5,262,245 describes a superalloy which can receive a durable EBPVD coating without the need for a bond coat. This superalloy contains aluminum and forms a TGO layer upon heating.

The thickness of the thermally grown oxide layer (TGO) has been found to be a significant factor in the coating longevity, excessively thick TGO layers (on the order of 10 microns are generally correlated with non durable ceramic coatings).

The EBPVD process is performed in conditions of relatively high vacuum. The TGO layer is developed by thermal oxidation. Currently the TGO growth step is performed by heating the part in a vacuum environment, generally less than $10^{-2}$ Torr and allow the oxygen which leaks in the vacuum system to react with the part to form the TGO layer. It is also known to controllably bleed oxygen or air into the chamber. The TGO growth step is generally performed as part of the preheat cycle used to heat the substrate to the temperature required for the ceramic layer deposition.

The rate of growth of the TGO layer depends on the oxygen concentration adjacent the part in vacuum chamber, the aluminum activity in the bond coat and time and temperature. TGO growth continues during ceramic coating distribution, but this is unavoidable. Difficulties have been encountered with excessively thick TGO layers in circumstances where the bond coat has particularly high aluminum activity so that the growth of the TGO layer is rapid, and also in circumstances where large part size (high thermal mass) leads to long heat up times and thereby forms an excessively thick TGO.

1. Field of the Invention

This invention relates to the application of coatings to substrates or to substrates that have a coating therein which contains aluminum. This invention has particular relevance to the controlled formation of thin TGO layers.

2. Description of Related Art

U.S. Pat. Nos. 4,405,659; 4,676,994 and 5,538,796 describe methods for developing TGO layers. U.S. Pat. No. 5,087,477 describes a method for assuring stoichometry of the oxide ceramic insulating layer through the injection of oxygen into a chamber which partly surrounds the part being coated. U.S. Pat. No. 4,880,614 shows oxygen injection without a chamber surrounding the part. U.S. Pat. Nos. 4,405,659; 5,538,796 and 5,514,482 describe the application and utilization of MCrAlY bond coats and diffusion aluminide bond coats. U.S. Pat. No. 5,262,245 describes an alloy which can receive a ceramic coating without the requirement of a separate bond coat.

SUMMARY OF THE INVENTION

According to the present invention the part to be coated is maintained at a vacuum level of less than about $10^{-2}$ Torr during the preheat process. This vacuum level refers to the overall vacuum level within the coating chamber. An amount of inert gas is continually flowed into the chamber, preferably immediately adjacent the part, during the preheat process, and most particularly during preheating from above about 1000° F., and preferably above 1200° F., to the substrate temperature desired during coating which is generally on the order of about 1600°–1900° F. Significant TGO growth does not occur below 1,000° F. and usually not below 1200° F. The gas may be truly inert such as argon, helium, xenon, krypton and the like and mixtures thereof, or may be non reactive with respect to the part to be coated, under the preheat conditions, for example hydrogen and nitrogen and mixtures thereof.

Theoretically, nitrogen may cause formation of nitride phases in some alloys but this is not anticipated for superalloy substrates and bond coats used for gas turbine engine applications. Hydrogen is known to cause embrittlement in some alloys, but again this is not anticipated to occur in the TBC situation. The assignee of the present invention prefers argon, but the skilled practitioner will have no difficulty in evaluating and selecting a suitable gas. Mixtures of inert and non reactive gases may also be used.

According to the invention, the part is surrounded by a cloud of inert or non oxidizing gas which tends to lower the oxygen level adjacent to the part and thereby lowers the rate of TGO growth. It should be noted that the objective is to lower and control the rate of TGO growth (and the final TGO thickness) rather than to eliminate oxidation altogether since a TGO layer is a highly desired feature of a part prior to its receiving ceramic top coat.

DESCRIPTION OF PREFERRED EMBODIMENTS

U.S. Pat. No. 5,087,477 describes the addition of oxygen during the application of an EBPVD ceramic top coat layer. FIG. 1 of this patent shows an enclosure which partially surrounds the part and which has associated therewith the manifold system for delivering oxygen during the application of the ceramic coating. The enclosure serves to increase the oxygen partial pressure (the oxygen activity) of the environment immediately surrounding the part to be coated.

Oxygen injection, is used during the application of the ceramic layer to ensure that the oxide which is deposited contains the full amount of oxygen required to reach the stoichometric level in the oxide being deposited. Usually the oxide being deposited is zirconia stabilized with yttria. Without this oxygen enhancement the zirconia tend to be deficient in oxygen. TGO growth continues during ceramic coating application, oxygen is usually added during ceramic deposition and is also present from the disassociated ceramic. In addition to oxygen, it is also known to inject air into the chamber as an oxidizing gas.

U.S. Pat. No. 4,880,614 illustrates a similar approach to that of U.S. Pat. No. 5,087,477, using one or more nozzles to direct oxygen at the part during coating without the use of a part surrounding enclosure.

The essence of the present invention is the injection of an inert or non reactive gas in the region surrounding the part using for example the same type of manifold and enclosure is shown in U.S. Pat. No. 5,087,477 or the nozzle arrangement of the type shown in U.S. Pat. No. 4,880,614. We have found that the use of an amount of inert or non oxidizing gas comparable or greater than to the amount of oxygen which is deposited later in the cycle is sufficient to substantially reduce the rate of TGO growth during the preheat cycle.

Those skilled in the art will recognize the difficulty of being specific with parameter values since the process is partially dependent upon process equipment characteristics and characteristics of the substrate to be coated. The rate of growth of the TGO depends upon the part temperature, the length of the preheat cycle, the aluminum activity of the surface, and upon the oxygen activity in the chamber.

The time and temperature during the preheat cycle effects the TGO growth layer, longer times, and higher temperatures, produce thicker TGO layers, and larger parts take longer to heat up and consequently generally exhibit thicker TGO layers. Thus the skilled practitioner will balance these equipment factors, the nature of the bond coat, if any, and the part mass and heat up time (and temperature) to arrive at a process which produces a TGO layer of the desired thickness, usually about 1 micron. In my process I used an amount of oxygen injection/min approximately equal to $0.4 \times 10^{-3} \times$ the coating chamber vol. As a broad guideline an oxygen injection per minute of $10^{-4}$–$10^{-2}$ of the coating chamber vol. should be suitable. In these guidelines the oxygen flow is measured at STP (standard pressure and temperature 760 mm Hg and 25° C.).

The aluminum activity on the part surface is a function of surface composition and we have found that aluminide type bond coats generally have higher TGO growth rates than MCrAlY bond coats.

The oxygen activity in the chamber is controlled by the competition between the leakage rate of oxygen of the external atmosphere (air) into the chamber, combined with any oxygen which may have been adsorbed or otherwise retained in the chamber, in competition with the pumping rate of the vacuum system which is used to maintain the vacuum environment. Some degree of leakage is inevitable but it should be minimized. Consequently these equipment parameters, leak up rate and pumping efficiency largely control the oxygen activity.

In addition there are different general types of EBPVD apparatus. The production apparatus which is used by the assignee of the present invention comprises a single chamber in which the preheat steps and coating steps are performed sequentially. In this type of system preheating is generally accomplished using the same electron beam system which is subsequently used to evaporate the ceramic. During the preheat process the electron beam is used to directly or indirectly preheat the part. In this type of arrangement where preheating occurs in the same chamber which the ceramic coating deposition subsequently occurs, after a period of use the chamber walls becomes coated with ceramic. This coating is porous with a high effective surface area. This porous high surface area coating can contain substantial adsorbed oxygen and water vapor which will slowly be released during the preheat process providing oxygen which can contribute to the excessive TGO growth.

The other general type of coating equipment uses a separate preheat chamber generally comprise a preheat chamber in which the part is preheated by radiant electrical heaters. Coating is performed in a separate chamber. Consequently the preheat chamber walls do not become ceramic coated. This type of apparatus is less prone to cause excessive TGO growth because the amount of oxygen adsorbed in the preheat chamber is reduced compared to the previously described single chamber system. Nonetheless even in the multiple chamber system with separate preheat there may be circumstances under which the use of an inert gas or non oxidizing gas to control TGO growth rate and thickness may be desirable.

The invention comprises surrounding the part with a quantity of inert or non reactive gas sufficient to moderate, reduce, and control the rate of TGO layer growth. It should be noted that even inert gases such as argon and helium, and non oxidizing gases such as nitrogen and hydrogen generally contain impurities, such as water vapor, which can cause oxidation. Thus the skilled practitioner will recognize the need to measure the water vapor content in the inert or non oxidizing gas being used and factor that into the overall performance of the preheat cycle to arrive at the desired TGO layer thickness. We have used argon having a dew point of between −30 and −50° F. with good success. However different circumstances may require a different dew point.

The present invention will be better understood by consideration of the following illustrative examples.

EXAMPLE I

A small gas turbine blade having the length of about 4 inches and a weight of about 3 ounces was to be coated with a thermal barrier coating using an aluminide bond coat. The use of an aluminide bond coat for thermal barrier coatings is described in U.S. Pat. Nos. 5,403,669 and 5,514,482.

The coating apparatus was of the single chamber type and had an internal vol. of about 1.4 m$^3$ and a leak up rate of from about 8–30 microns per hour (with vacuum pumps not evacuating the chamber).

After applying the thermal barrier coating system in a single chamber vacuum system wherein the operating chamber pressure was less than about $10^{-2}$ Torr and the preheat time from about 1200° F. to about 1600° F. was about 13 min, combined with the ceramic coating cycle time of (during 42 min. which TGO growth occurs) it was found that the TGO layer was about 2.5–5.0 microns thick and the outer oxide ceramic layer (zirconia stabilized with 8% yttria) was generally non-adherent and spalled upon cooling.

EXAMPLE II

In Example II the same equipment, blade type, operating parameters and bond coat were employed except during the preheat process, starting at a temperature of less than about 1200° F., 554 sccn per minute of argon having a dew point in the range of −30 to −50° F. was flowed in the vicinity of the part using a part surrounding enclosure as described in U.S. Pat. No. 5,087,477. After preheating with this argon addition, at the conclusion of the preheat and coating cycle time of 42 minutes, the TGO layer was 0.5–2.0 microns thick and the columnar zirconia based oxide layer was fully adherent and durable.

EXAMPLE III

The same equipment and operating parameters were used to deposit a stabilized zirconia TBC on and industrial gas turbine engine part having a length of about 12 inches and a weight of about 8 lbs. The preheat time for this part was about 35 minutes and the coating cycle time as about 50 minutes for a total TGO growth time window of about 85 minutes. Without the use of inert gas injection during preheat the TGO layer thickness varied from 3.5 to 6 microns, and the TBC longevity was unsatisfactory. When Argon was flowed adjacent during preheating the TGO thickness ranged from 0.7 to 2.2 microns and the TBC was adherent and long lived.

Although this invention has been shown and described with respect to the detailed embodiments thereof, it will be understood by those skilled in the art that various changes in the form and detail thereof may be made without departing from the spirit and scope of the claimed invention.

I claim:

1. A method for controlling the oxidation of a superalloy part while heating said part, in a vacuum environment, which comprises: heating said part using a heat source selected from the group consisting of electron beams and radiant electric heaters while continuously providing a gas selected from the group consisting of inert and non reactive gases and mixtures thereof to the region immediately surrounding the superalloy part, thereby reducing the oxygen level adjacent to the part and maintaining the part in a vacuum environment of less than about $10^{-2}$ Torr; whereby oxidation of said part due to oxygen in said vacuum environment is reduced.

2. A method as in claim 1 wherein said part comprises a superalloy substrate having an aluminum containing bond coat.

3. A method as in claim 2 wherein said bond coat comprises an MCrAlY coating.

4. A method as in claim 2 wherein said bond coat comprises an aluminide coating.

5. A method as in claim 1 wherein said part comprises an aluminum containing superalloy substrate without a bond coat.

6. A method as in claim 1 wherein said inert gas is selected from the group consisting of Ar, Ne, Kr, Xe and mixtures thereof.

7. A method as in claim 1 wherein said non reactive gas is selected from the group consisting of N, H and mixtures thereof.

8. A method as in claim 2 wherein said gas is provided during that part of the heating method where the substrate temperature exceeds about 1000° F.

9. A method as in claim 2 wherein said gas is provided during that part of the heating method where the part temperature exceeds about 1200° F.

10. A method as in claim 1 wherein said gas is injected into a chamber which partially surrounds the part.

11. A method as in claim 1 wherein said gas is injected into the region immediately surrounding the part through at least one nozzle.

12. A method for preheating a superalloy gas turbine component in a vacuum environment prior to the application of a ceramic coating, wherein said superalloy gas turbine component has an outer surface which contains aluminum, which comprises: heating the part using a heat source selected from the group consisting of electron beams and radiant electric heaters continuously adding a gas selected from the group consisting of Ar, He, N, H, Xe, Kr, and mixtures thereof into the region immediately surrounding the part to reduce tee rate of alumina formation during preheating, while maintaining the part in a vacuum environment of less than about $10^{-2}$ Torr.

13. A method as in claim 12 wherein said component comprises a superalloy substrate having an aluminum containing bond coat.

14. A method as in claim 13 wherein said bond coat comprises an MCrAlY coating.

15. A method as in claim 13 wherein said bond coat comprises an aluminide coating.

16. A method as in claim 12 wherein said component comprises an aluminum coating superalloy substrate without a bond coat.

17. A method as in claim 13 wherein said gas is provided during that part of the preheat cycle where the substrate temperature exceeds about 1000° F.

18. A method as in claim 12 wherein said gas is injected into a chamber which partially surrounds the part to be preheated.

19. A method as in claim 12 wherein said gas is injected into the region immediately surrounding the part through at least one nozzle.

* * * * *